US007449955B2

(12) United States Patent
Shih

(10) Patent No.: US 7,449,955 B2
(45) Date of Patent: Nov. 11, 2008

(54) CHAIN-CHOPPING CURRENT MIRROR AND METHOD FOR STABILIZING OUTPUT CURRENTS

(75) Inventor: Fu-Yang Shih, Kaohsiung (TW)

(73) Assignee: Silicon Touch Technology Inc., Hsinchu (TW)

( * ) Notice: Subject to any disclaimer, the term of this patent is extended or adjusted under 35 U.S.C. 154(b) by 34 days.

(21) Appl. No.: 11/309,074

(22) Filed: Jun. 16, 2006

(65) Prior Publication Data

US 2007/0241822 A1 Oct. 18, 2007

(30) Foreign Application Priority Data

Apr. 12, 2006 (TW) .............................. 95112969 A

(51) Int. Cl.
*H03F 3/04* (2006.01)

(52) U.S. Cl. ...................................................... 330/288

(58) Field of Classification Search ....................... None
See application file for complete search history.

(56) References Cited

U.S. PATENT DOCUMENTS 4,408,190 A * 10/1983 Nagano ...................... 341/135
6,181,206 B1 * 1/2001 Palmisano et al. .......... 330/278
6,714,080 B2 * 3/2004 Burns ......................... 330/288
6,958,719 B2 * 10/2005 Moon ......................... 341/135

* cited by examiner

*Primary Examiner*—Robert J. Pascal
*Assistant Examiner*—Alan Wong
(74) *Attorney, Agent, or Firm*—Jianq Chyun IP Office

(57) ABSTRACT

A chain-chopping current mirror and a method for stabilizing output currents are disclosed. The current mirror includes multiple output nodes, a bias source unit, multiple current mirroring units and multiple switch components. The bias source unit provides a reference bias according to the received current. Each of the current mirroring units outputs an output current according to the reference bias. The control terminal of each the switch component receives a clock signal and determines whether the first terminal thereof is coupled with the second terminal or the third terminal thereof according to the clock signal, wherein the first terminal of the $i^{th}$ switch component is coupled with the output terminal of the $i^{th}$ current mirroring unit, the second terminal thereof is coupled with the $i^{th}$ output node and the third terminal thereof is coupled with the $(i+1)^{th}$ output node, where i is a natural number.

20 Claims, 13 Drawing Sheets

CHAIN-CHOPPING CURRENT MIRROR AND METHOD FOR STABILIZING OUTPUT CURRENTS

CROSS-REFERENCE TO RELATED APPLICATION

This application claims the priority benefit of Taiwan application serial no. 95112969, filed on Apr. 12, 2006. All disclosure of the Taiwan application is incorporated herein by reference.

BACKGROUND OF THE INVENTION

1. Field of Invention

The present invention relates to a current mirror, and more particularly, to a chain-chopping current mirror and a method for stabilizing output currents.

2. Description of the Related Art

In various application circuits, such as an amplifier, an multi-channel constant current driver and so on, a current mirror is often required as a bias circuit of the above-mentioned circuits. FIG. 1 is a drawing of a conventional current mirror circuit configuration. Referring to FIG. 1, the current mirror includes five transistors MP1~MP5. The transistor MP1 produces a bias at the gate thereof according to the input current at an input terminal I101. The gates of the transistors MP2~MP5 are coupled with the gate of the transistor MP1 to receive the gate bias of the transistor MP1 and the transistors MP2~MP5 respectively and output a current according to the gate bias and the proportions among the sizes of the transistors MP2~MP5.

For some applications, the above-mentioned channel sizes of the transistors MP2~MP5 are equal to each other, which is designed purposely for outputting the same current at every output node (also called 'current channel') OUT1~OUT4. However, due to an imperfect IC (integrated circuit) process, a deviation between the real output current at the output nodes OUT1~OUT4 and the originally desired current may occurs.

To make the current passing through every current channel equal to each other, a prior art configuration called 'cross-chopping current mirror' was provided as shown in FIG. 2. Referring to FIG. 2, in the circuit herein, in addition to the transistors MP1~MP5 of the original current mirror, two transmission-gates functioning as switches are further disposed between every two adjacent transistors and two adjacent output terminals, i.e. eight transistors in total, SW1~SW8. By using a first clock signal CK and a second clock signal CKB, the transmission-gates SW1~SW8 of the circuit are controlled to be turned on or off, wherein the first clock signal CK and the second clock signal CKB are phase-inverted to each other.

When the first clock signal CK takes a logic-high level, the second clock signal CKB takes a logic-low level. At the point, the output node OUT1 outputs a current passing through the transistor MP2, the output node OUT2 outputs a current passing through the transistor MP3, the output node OUT3 outputs a current passing through the transistor MP4 and the output node OUT4 outputs a current passing through the transistor MP5. When the first clock signal CK takes a logic-low level, the second clock signal CKB takes a logic-high level. At the point, the output node OUT1 outputs a current passing through the transistor MP3, the output node OUT2 outputs a current passing through the transistor MP2, the output node OUT3 outputs a current passing through the transistor MP5 and the output node OUT4 outputs a current passing through the transistor MP4.

Although the above-described cross-chopping current mirror is able to average the currents of the current channel OUT1 and the current channel OUT2 and the currents of the current channel OUT3 and the current channel OUT4, respectively, however, output current variations with the above-described design still remain. It is assumed that the desired current of the original design is I; under the process influence, the real output current of the transistor MP2 is I+a, the real output current of the transistor MP3 is I+b, the real output current of the transistor MP4 is I−c and the real output current of the transistor MP5 is I−d; all of a, b, c and a are larger than zero. By using the scheme of the above-described cross-chopping current mirror, the output current at the output nodes OUT1 and OUT2 is I+(a+b)/2, while the output current at the output nodes OUT3 and OUT4 is I−(c+d)/2, therefore, an output current difference between at OUT2 and OUT3 would be (a+b+c+d)/2.

SUMMARY OF THE INVENTION

An objective of the present invention is to provide a chain-chopping current mirror for improving the performance of the conventional current mirror to advance the equality of the output currents.

Another objective of the present invention is to provide a method for stabilizing output currents for reduce the current difference between adjacent current channels.

The present invention provides a chain-chopping current mirror, which includes multiple output nodes, a bias source unit, multiple current mirroring units and multiple switch components. The bias source unit provides a reference bias at the reference voltage terminal thereof according to a current received by the input terminal thereof. Each current mirroring unit includes a bias input terminal and an output terminal, the bias input terminal is coupled with the reference voltage terminal to receive the reference bias and an output current is output at the output terminal thereof according to the reference bias. Each switch component includes a first terminal, a second terminal, a third terminal and a control terminal; the control terminal receives a clock signal, and whether the first terminal is coupled with the second terminal or the third terminal thereof is determined according to the clock signal. Wherein, the first terminal of the $i^{th}$ switch component is coupled with the output terminal of the $i^{th}$ current mirroring unit, the second terminal thereof is coupled with the $i^{th}$ output node and the third terminal thereof is coupled with the $(i+1)^{th}$ output node where i is a natural number.

According to the chain-chopping current mirror described in an embodiment of the present invention, the above-mentioned bias source unit includes a first transistor, wherein the gate terminal thereof is coupled with the first source/drain thereof, the second source/drain thereof is coupled with a first voltage level, the first source/drain is coupled with the input terminal of the bias source unit and the gate thereof is coupled with the reference voltage terminal of the bias source unit. In another embodiment, the bias source unit further includes a second transistor, wherein the gate thereof is coupled with a bias voltage, the first source/drain thereof is coupled with the input terminal of the bias source unit and the second source/drain thereof is coupled with the first source/drain of the first transistor.

According to the chain-chopping current mirror described in an embodiment of the present invention, each of the above-mentioned current mirroring units includes a third transistor, wherein the gate thereof is coupled with the reference voltage terminal to receive the bias voltage, the first source/drain thereof is coupled with the output terminal of the current mirroring unit and the second source/drain thereof is coupled with the first voltage level. In another embodiment, the bias source unit further includes a fourth transistor, wherein the gate thereof is coupled with a bias voltage, the first source/drain thereof is coupled with the output terminal of the current mirroring unit and the second source/drain thereof is coupled with the first source/drain of the third transistor.

According to the chain-chopping current mirror described in an embodiment of the present invention, the above-mentioned clock signal includes a first clock signal and a second clock signal, and each switch component includes: a first transmission-gate, which includes a first control terminal, a second terminal, a first transmission terminal and a second transmission terminal, wherein the first control terminal receives the first clock signal, the second control terminal receives the second clock signal, the first transmission terminal is coupled with the first terminal of the switch component and the second transmission terminal is coupled with the second terminal of the switch component; a second transmission-gate, which includes a first control terminal, a second terminal, a first transmission terminal and a second transmission terminal, wherein the first control terminal receives the second clock signal, the second control terminal receives the first clock signal, the first transmission terminal is coupled with the first terminal of the switch component and the second transmission terminal is coupled with the third terminal of the switch component.

According to the chain-chopping current mirror described in an embodiment of the present invention, the above-mentioned first transistor, each of the second transistor, the third transistor and the fourth transistor is a P-type metal oxide semiconductor field effect transistor (MOSFET).

The present invention provides a method for stabilizing output currents, which includes the following steps. First, multiple output nodes are provided. Next, a reference bias is provided according to an input current. Afterwards, multiple current mirroring units are provided and each current mirroring unit outputs an output current according to the reference bias. At a first time, the output terminal of the $i^{th}$ current mirroring unit is controlled for coupling with the $i^{th}$ output node. Furthermore, at a second time, the output terminal of the $i^{th}$ current mirroring unit is controlled for coupling with the $(i+1)^{th}$ output node. Wherein, i is a natural number.

According to the method for stabilizing output currents described in an embodiment of the present invention, the method further includes providing a clock signal; the time of a first status of the clock signal is the first time, and the time of a second status of the clock signal is the second time.

The present invention provides a chain-chopping current mirror, which includes multiple output nodes, a bias source unit, multiple current mirroring units and multiple switch components. The bias source unit provides a reference bias at the reference voltage terminal thereof according to a current received by the input terminal thereof. Each current mirroring unit includes a bias input terminal and an output terminal, the bias input terminal is coupled with the reference voltage terminal of the bias source unit to receive the reference bias and an output current is output at the output terminal thereof according to the reference bias. Each of the switch components includes 1~(K+1) terminals, i.e. from the first terminal to the $(K+1)^{th}$ terminal, and the first terminal thereof is coupled with one of the K terminals, i.e. from the second terminal to the $(K+1)^{th}$ terminal, in response to one of the K clock signals, i.e. from the first clock signal to the $K^{th}$ clock signal. Wherein, the first terminal of the $i^{th}$ switch component is coupled with the output terminal of the $i^{th}$ current mirroring unit and the $m^{th}$ terminal thereof is coupled with the $(i+m-1)^{th}$ output node where i, K and m are natural numbers.

According to the chain-chopping current mirror described in an embodiment of the present invention, each of the above-described switch components includes K switch units and each of the switch units includes a control terminal, a first terminal and a second terminal. The control terminals of the $(1\text{~}K)^{th}$ switch units respectively receive the $(1\text{~}K)^{th}$ clock signals, wherein the first terminal of the $a^{th}$ switch unit is coupled with the first terminal of the switch component and the second terminal of the $a^{th}$ switch unit is coupled with the $(a+1)^{th}$ terminal of the switch component. Each of the clock signals includes a first status and a second status, the frequency of every clock signal is the same, between the $(b-1)^{th}$ clock signal and the $b^{th}$ clock signal there is a predetermined phase difference, and the time for each clock signal to take the first status is not overlapped with each other, where $0<a$ or $b<K$.

Since all the current channels are connected in series to each other through the switches and multiple series switching operations are conducted in the present invention, the goal to advance the equality of the output currents and the goal to reduce the current difference between adjacent current channels are achieved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1:
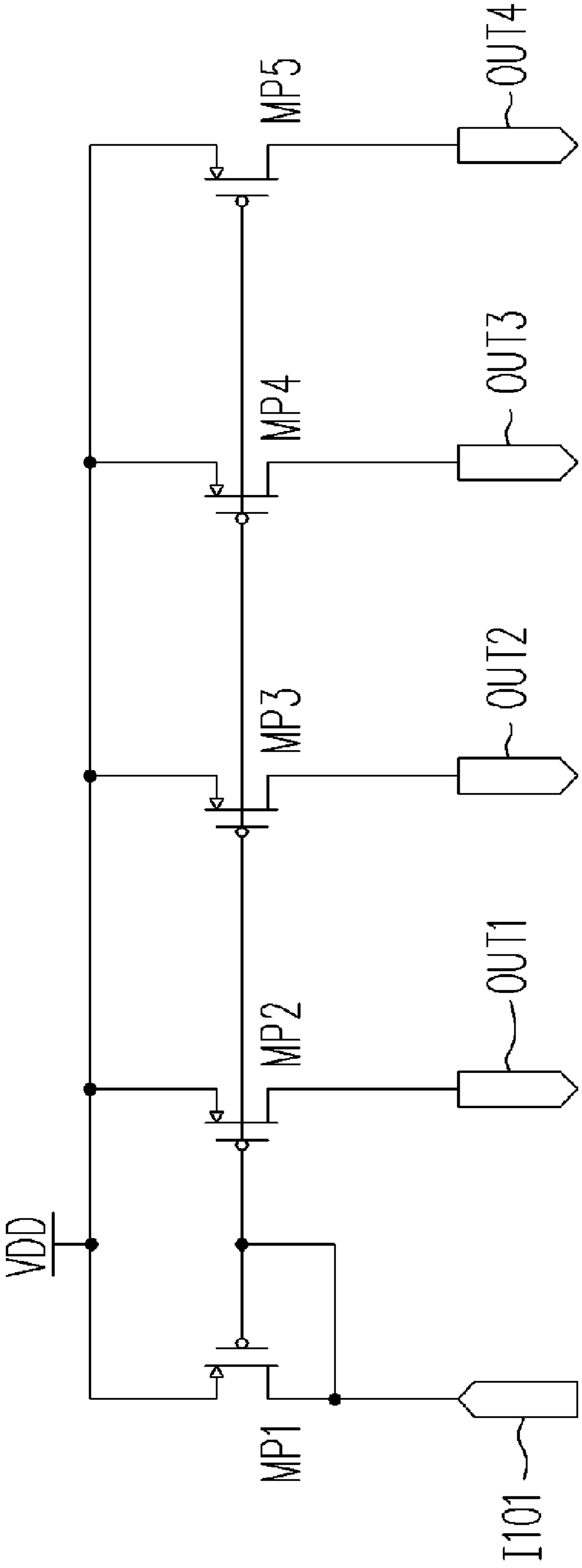
FIG. 1 (PRIOR ART)
FIG. 1 is a drawing of a conventional current mirror circuit configuration.
Figure 2:
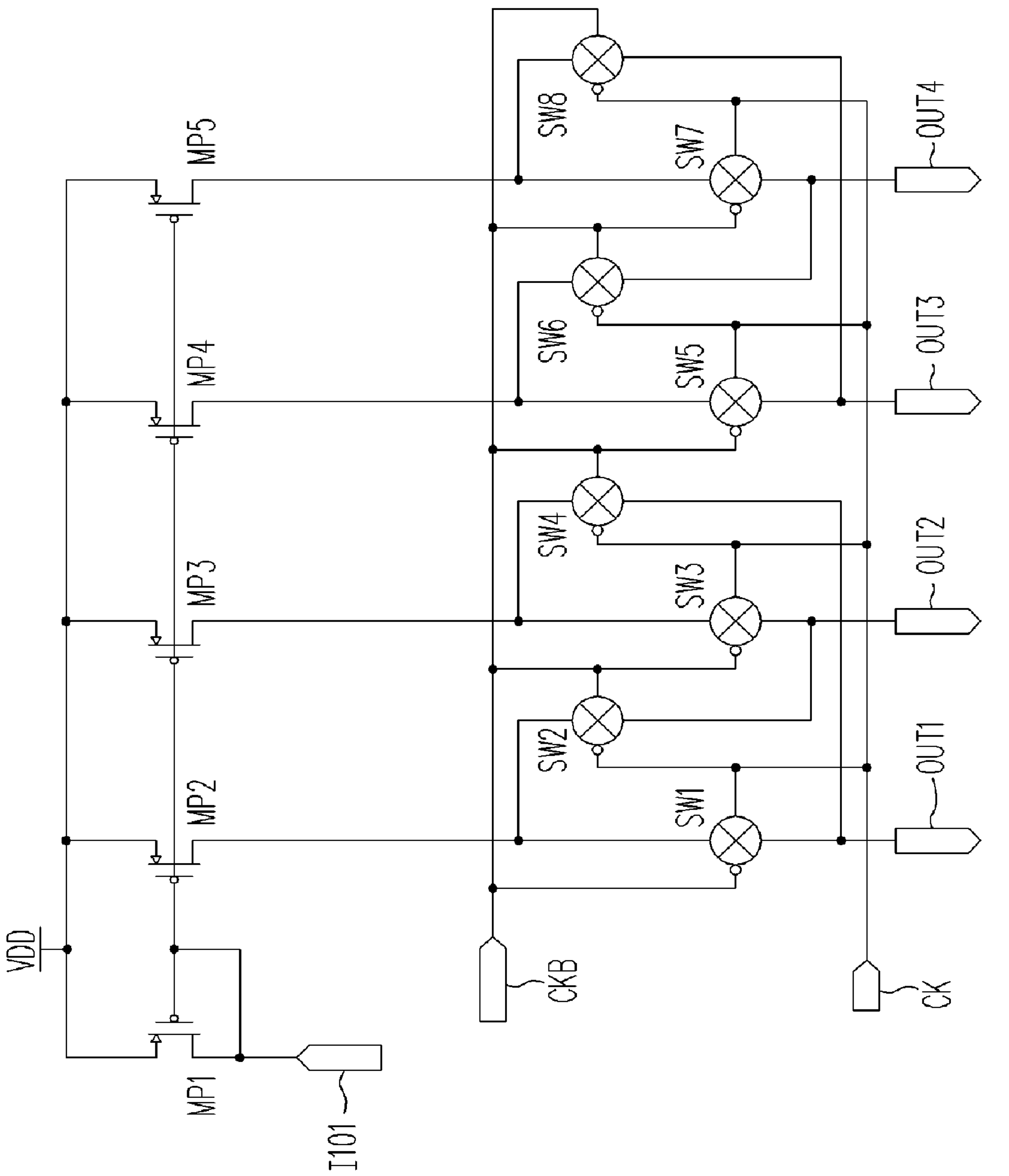
FIG. 2 (PRIOR ART)
FIG. 2 is a drawing of a conventional cross-chopping current mirror circuit.
Figure 3:
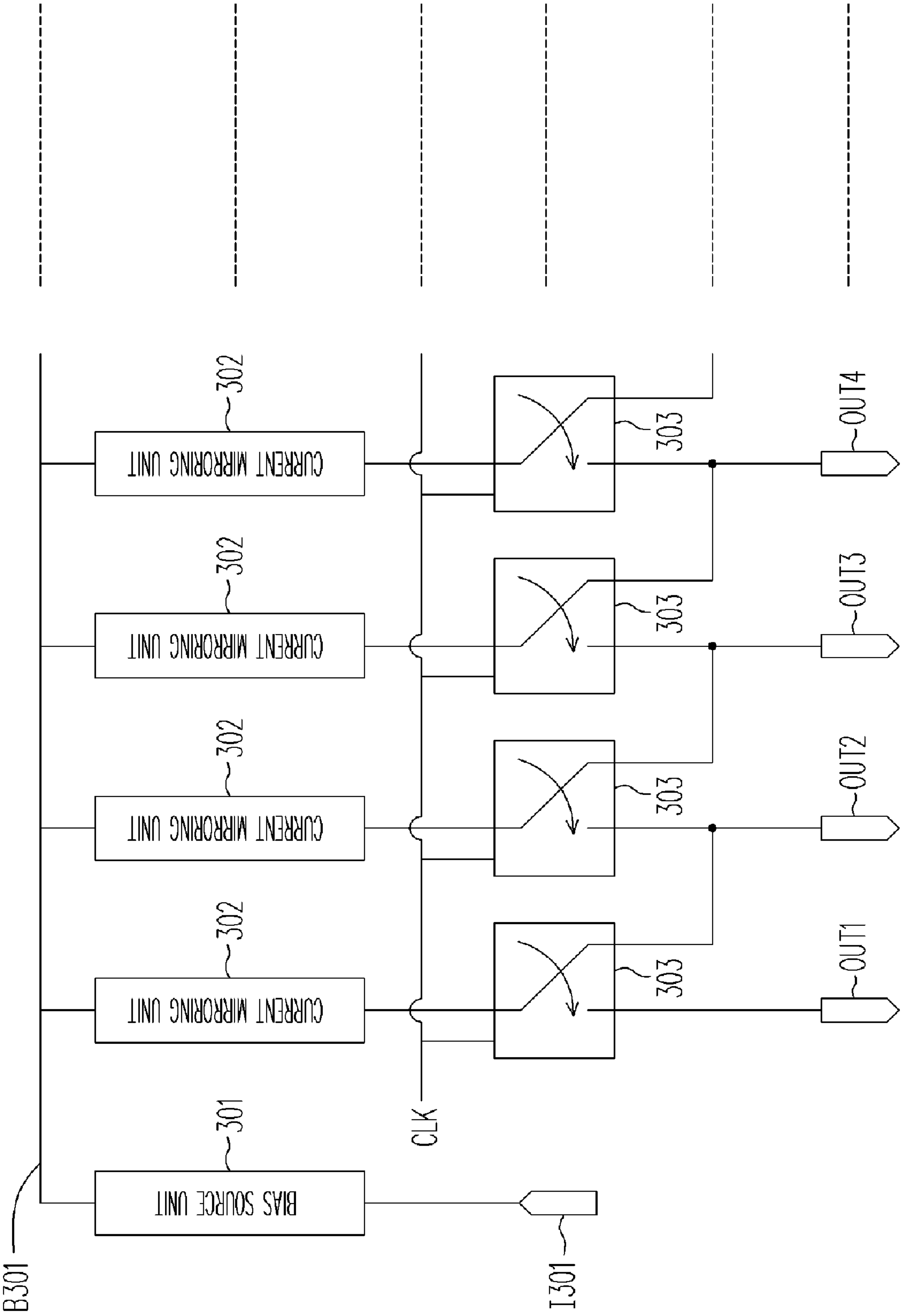
FIG. 3 is a block diagram of a chain-chopping current mirror circuit according to an embodiment of the present invention.

FIG. 3 is a block diagram of a chain-chopping current mirror circuit according to an embodiment of the present invention. Referring to FIG. 3, the current mirror includes a bias source unit 301, multiple current mirroring units 302, multiple switch components 303 and multiple output nodes OUT1~OUTN.

The bias source unit 301 provides a reference bias B301 at a reference voltage terminal R301 according to the received current at an input terminal I301. Each current mirroring unit 302 includes a bias input terminal and an output terminal and the bias input terminal is coupled with the reference voltage terminal R301 to receive the reference bias B301. The output terminal of the current mirroring unit 302 outputs an output current according to the reference bias B301. Each switch component 303 includes a first terminal, a second terminal, a third terminal and a control terminal. The control terminal receives a clock signal, which decides whether the first terminal of the switch component is coupled with the second terminal thereof or the third terminal thereof. Wherein, the first terminal of the first switch component is coupled with the output terminal of the first current mirroring unit, the second terminal thereof is coupled with the first output node OUT1, the third terminal thereof is coupled with the second output node OUT2 and the rest can be deduced by analogy.

It should be noted that the chain-chopping current mirror of the above-described embodiment does not limit the present invention. Anyone skilled in the art knows that the design and connection of the switch component 303 geared to a specific application by manufacturers vary. Therefore, as long as switch components are used to connect the current mirroring units 302 serially and multiple series switching operations are conducted according to the clock signal CLK, it is considered to belong to the scope or spirit of the invention.

For anyone skilled in the art to easily implement the present invention, a couple of embodiments are given as follows.

Figure 4:
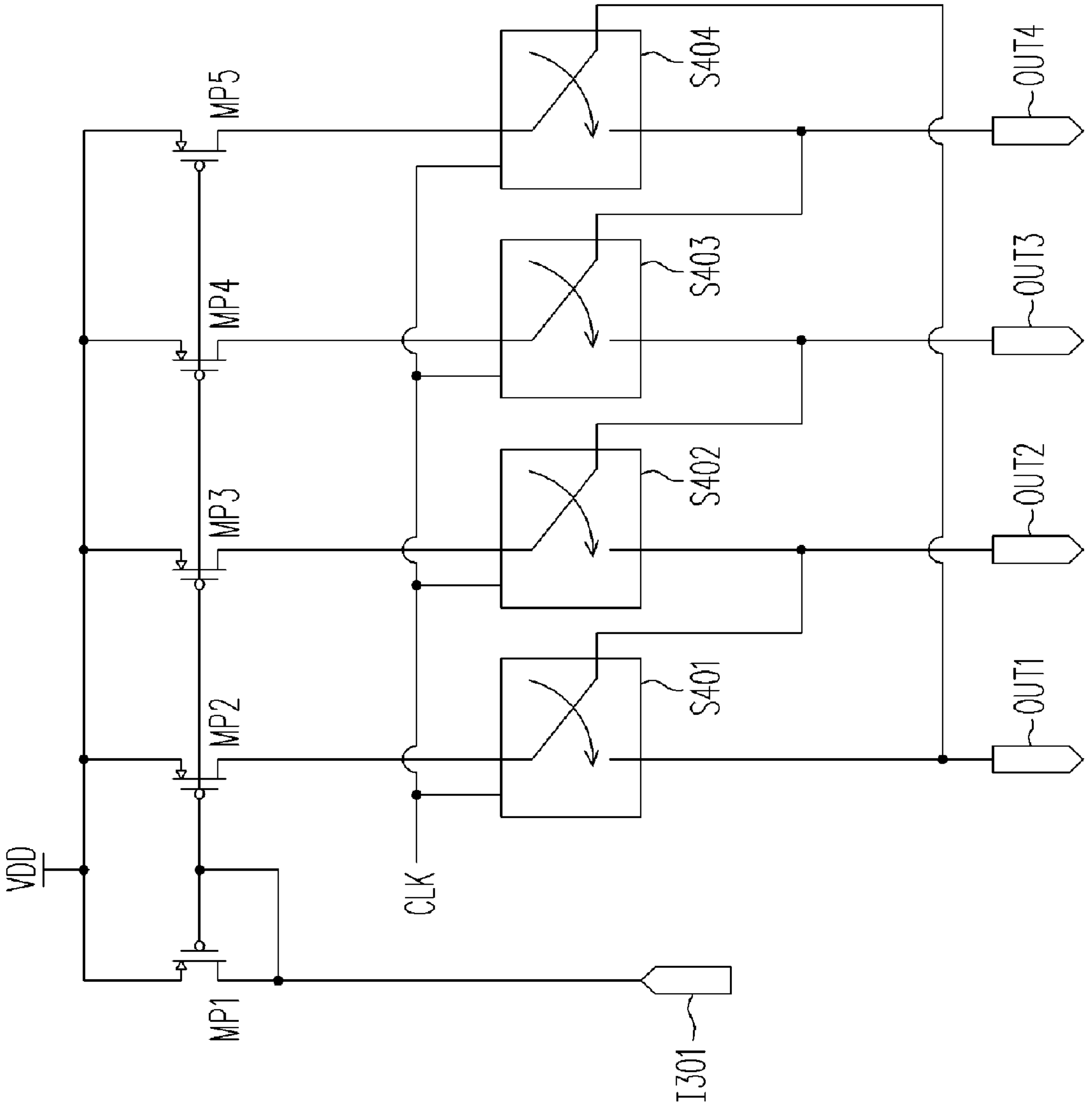
FIG. 4 is an implementation circuit drawing of the present embodiment in FIG. 3.

FIG. 4 is an implementation circuit drawing of the present embodiment in FIG. 3. In the embodiment, the bias source unit 301 is implemented by using a transistor MP1 connected to a diode, the multiple current mirroring units 302 are respectively implemented by using transistors MP2~MP5, and the second source/drain of each transistor of MP1~MP5 is coupled with a first voltage level VDD (the higher power supply voltage VDD herein). For simplicity, only four current mirroring units 302 (MP2~MP5) are given as exemplary in FIG. 4; however, the present invention does not limit the number of the current mirroring units. In fact, three or more than four current mirroring units 302 (transistors) can be disposed without departing from the scope or spirit of the invention.

When the clock signal CLK takes, for example, a logic-high level, the first terminal and the second terminal of the switch components S401, S402, S403 and S404 are in connection, the transistor MP2 is coupled with the first output node OUT1, the transistor MP3 is coupled with the second output node OUT2, the transistor MP4 is coupled with the third output node OUT3 and the transistor MP5 is coupled with the fourth output node OUT4.

When the clock signal CLK takes, for example, a logic-low level, the first terminal and the third terminal of the switch components S401, S402, S403 and S404 are in connection, the transistor MP2 is coupled with the second output node OUT2, the transistor MP3 is coupled with the third output node OUT3, the transistor MP4 is coupled with the fourth output node OUT4 and the transistor MP5 is coupled with the first output node OUT1. Based on such a chain-chopping working mode, the current mirror of the present invention is called 'chain-chopping current mirror'.

To explain the performance of the chain-chopping current mirror provided by the present invention, it is assumed that the nominal output current of the design is I; affected by the process, the real output current of the transistor MP2 is I+a, the real output current of the transistor MP3 is I+b, the real output current of the transistor MP4 is I+c and the real output current of the transistor MP5 is I+d. By using the above-described chain-chopping current mirror of the present embodiment, the output current at the output node OUT1 would be I+(d+a)/2, the output current at the output node OUT2 would be I+(a+b)/2, the output current at the output node OUT3 would be I+(b+c)/2 and the output current at the output node OUT4 would be I+(c+d)/2. From the above-described output current equations, it can be seen that the output current at each output node has a same 'average current error' as the prior art.

Furthermore, the maximum current differences of two adjacent output nodes are evaluated assuming all of a, b, c and d are larger than zero. A simple calculation indicates the maximum current difference of the output nodes OUT1 and OUT2 is (a+b)/2, the maximum current difference of the output nodes OUT2 and OUT3 is (b+c)/2 , the maximum current difference of the output nodes OUT3 and OUT4 is (c+d)/2 and the maximum current difference of the output nodes OUT4 and OUT1 is (d+a)/2. In comparison with the conventional cross-chopping current mirror where the maximum current difference of the two adjacent output nodes OUT2 and OUT3 is (a+b+c+d)/2, it is clear that the current difference of two adjacent output nodes in the chain-chopping current mirror of the embodiment is much less than the conventional cross-chopping current mirror.

Figure 5:
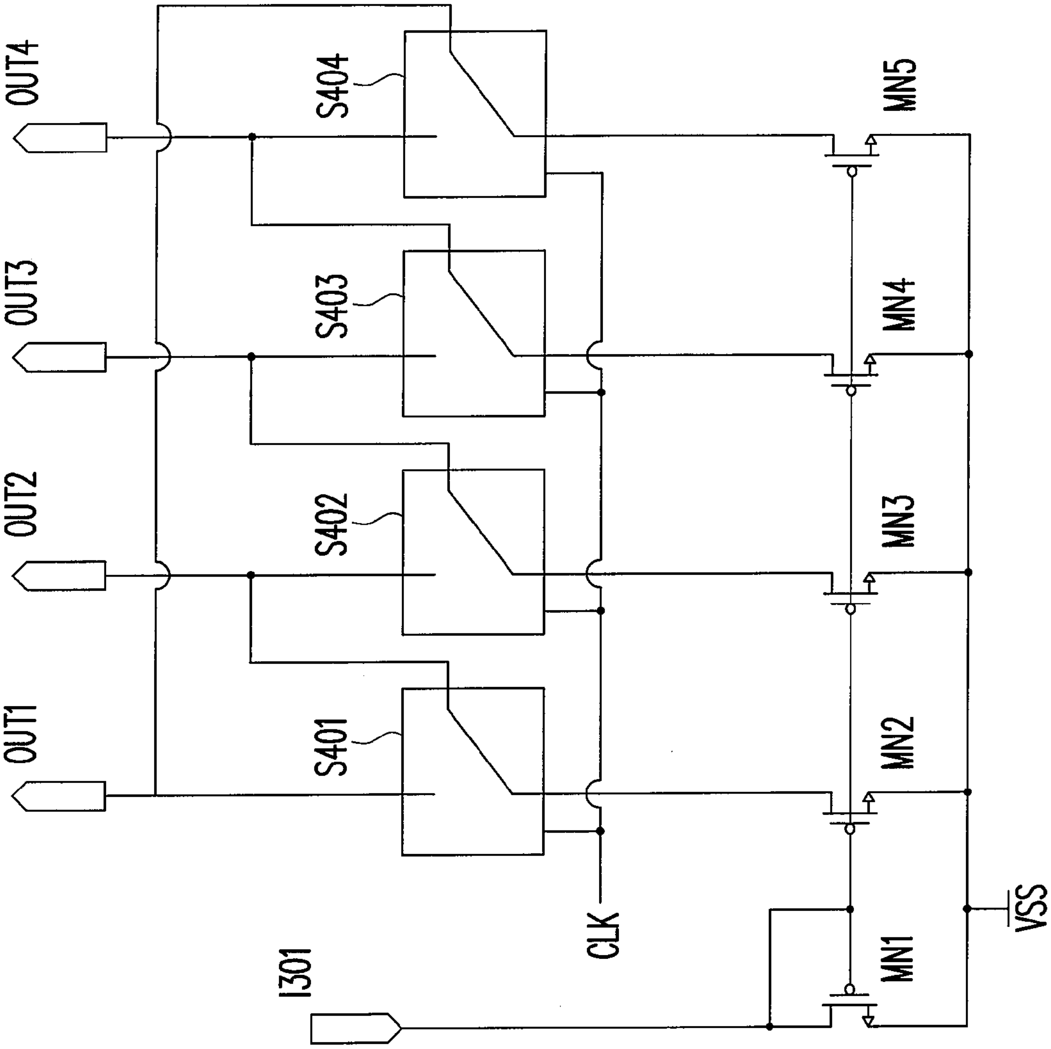
FIG. 5 is an alternation of the implementation circuit drawing of the present invention in FIG. 4.
Figure 6:
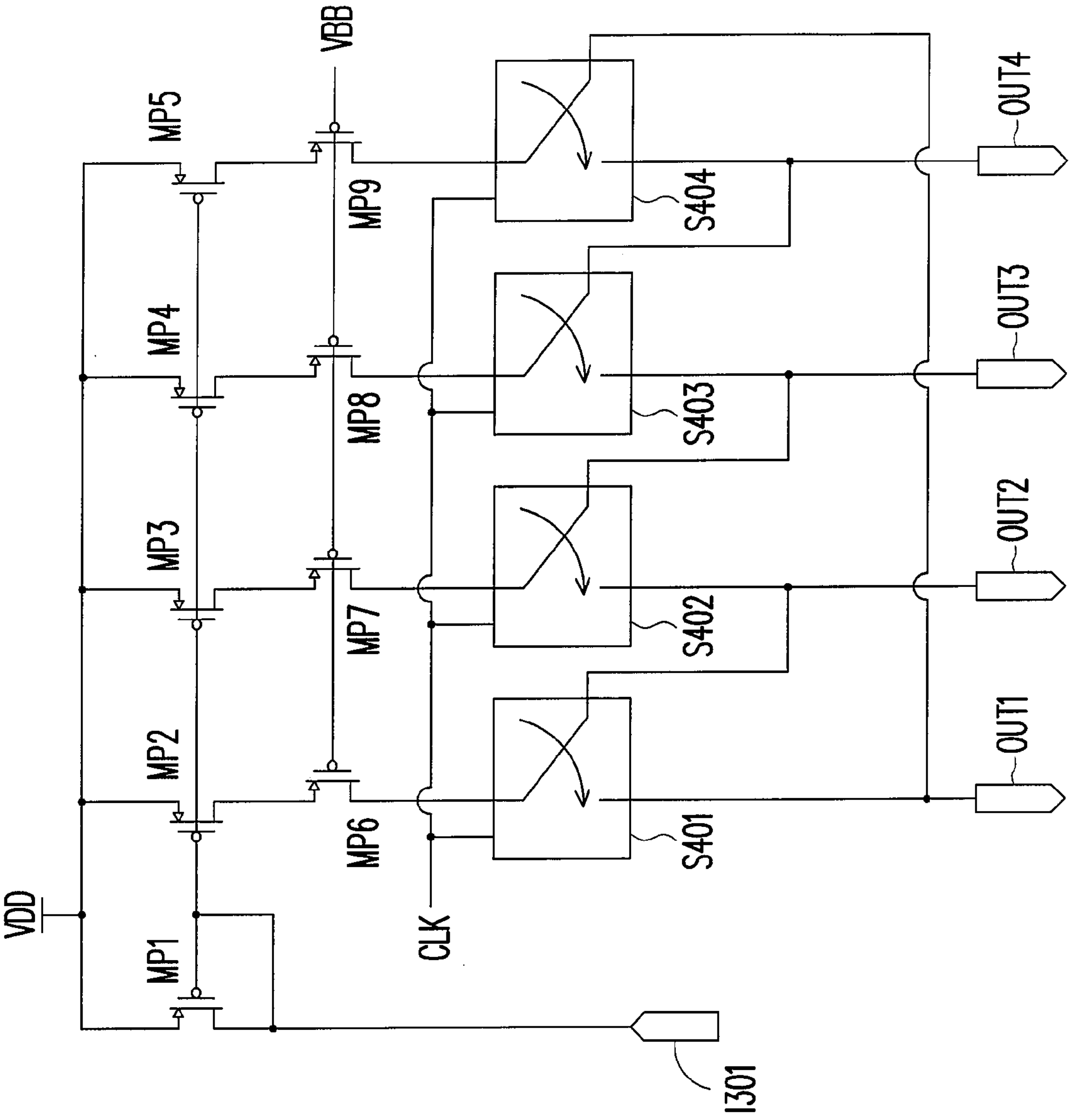
FIG. 6 is another implementation circuit drawing of the present embodiment in FIG. 3.
Figure 7:
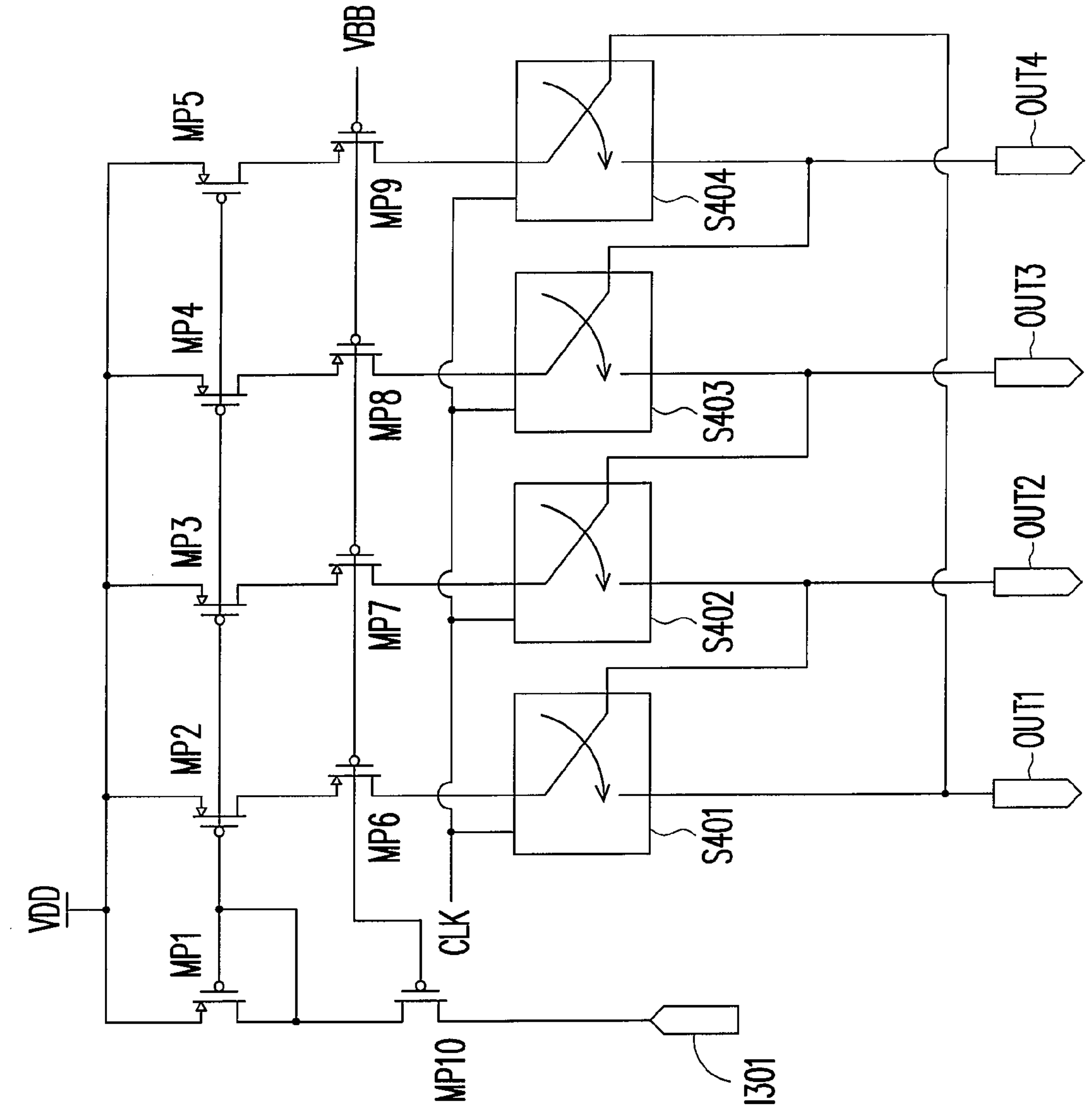
FIG. 7 is yet another implementation circuit drawing of the present embodiment in FIG. 3.

In the above-described embodiment, P-type transistors are used, however, the embodiment of the present invention allows using N-type transistors for another implementation as shown in FIG. 5. The embodiment of the present invention allows each of the transistors MP2~MP5 to respectively couple a transistor of MP6~MP9 and a bias voltage VBB to be applied at each gate of the transistors MP2~MP5 for adjusting the output currents of the output nodes OUT1~OUT4 as shown in FIG. 6. Further, the implementation shown in FIG. 6 allows adding a transistor MP10 coupled with the input terminal thereof to form yet another implementation as shown in FIG. 7. Furthermore, the circuits of FIG. 6 and FIG. 7 allow using N-type transistors as an alternative, which should be known by anyone skilled in the art and the detail is omitted herein for simplicity.

Figure 8:
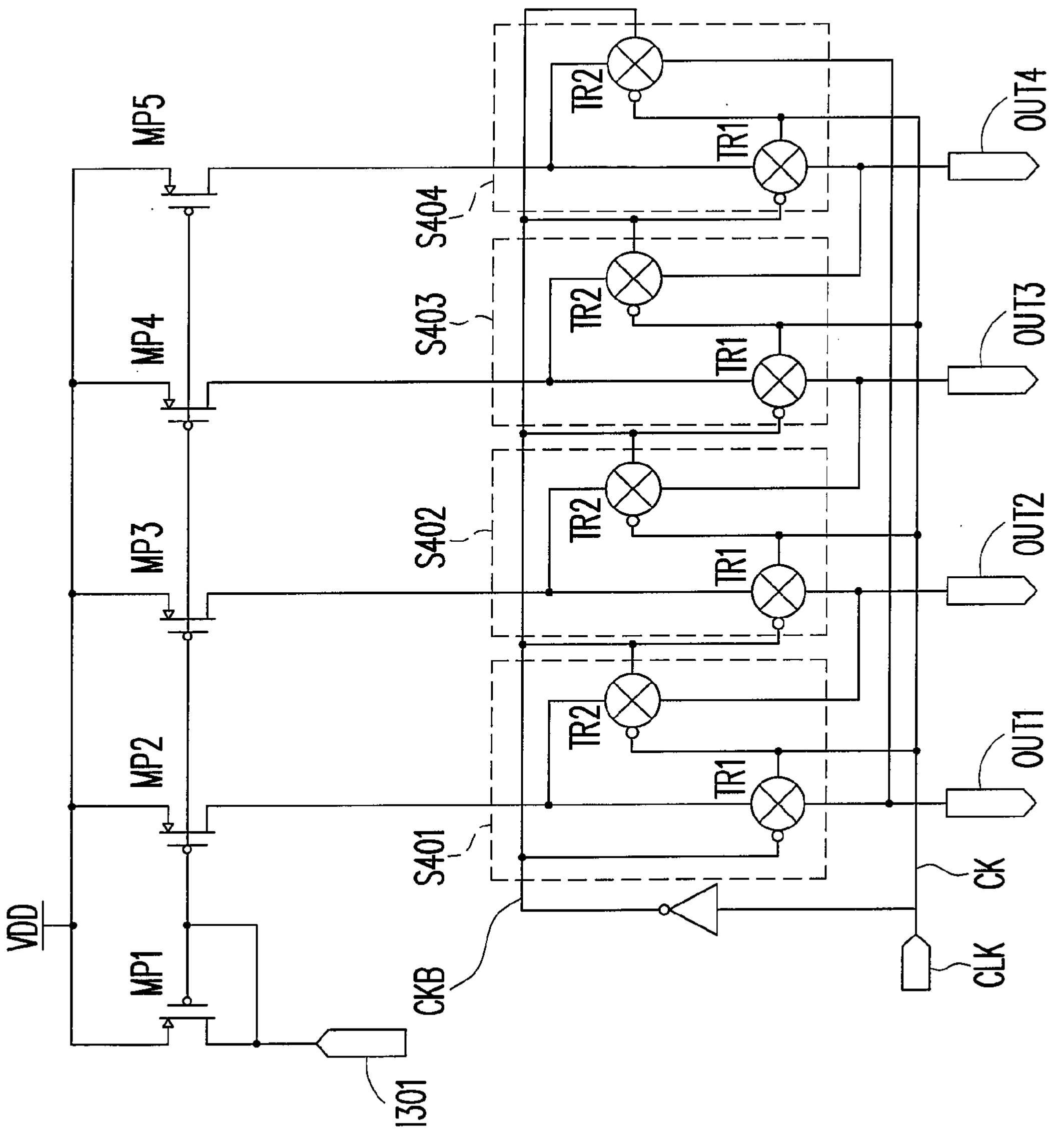
FIG. 8 is another alternation of the implementation circuit drawing of the present embodiment in FIG. 4.

FIG. 8 is another alternation of the implementation circuit drawing of the present embodiment in FIG. 4. In FIG. 8, each of the switch components S401~S404 in FIG. 4 is substituted by a first transmission-gate TR1 and a second transmission-gate TR2 and the clock signal CLK is divided by a first clock signal CK and a second clock signal CKB, wherein the clock signals CK and CKB are phase-inverted to each other. The first clock signal CK and the second clock signal CKB are provided to the first control terminal and the second control terminal of the first transmission-gate TR1 and a second transmission-gate TR2, respectively. In this way, the above-described switch components S401~S404 are switched.

Figure 9:
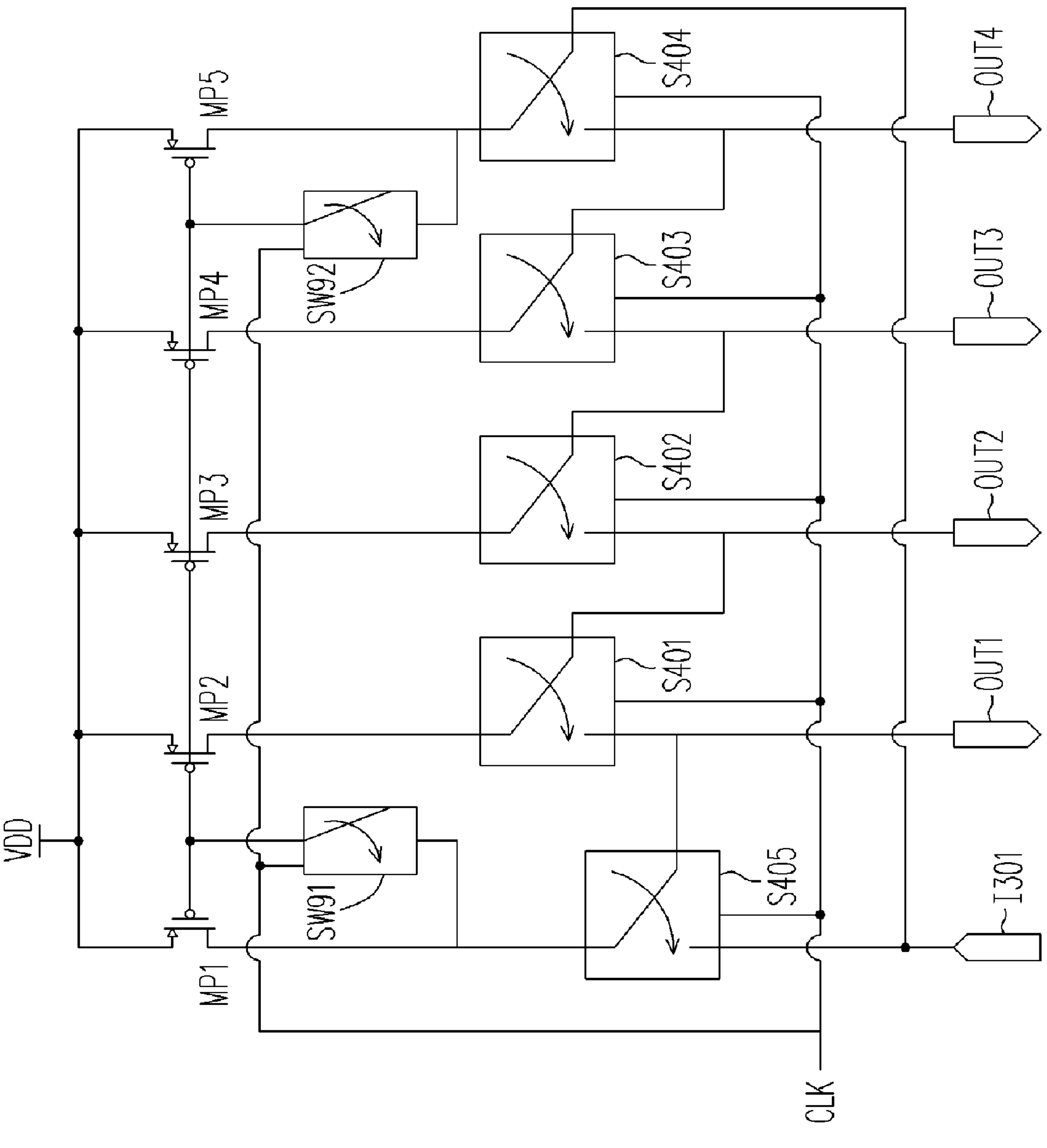
FIG. 9 is a schematic drawing of a chain-chopping current mirror circuit according to another embodiment of the present invention.

Although the above-described scheme is able to reduce the output current differences of different output nodes, however, if an error resulted from the process with the transistor MP1, MP1 may not match MP2~MP5, which causes a comprehensive current error at the output terminals OUT1~OUT4. To reduce the errors between the input current and the output currents, another embodiment of the present invention is provided. FIG. 9 is a schematic drawing of a chain-chopping current mirror circuit according to another embodiment of the present invention. Referring to FIG. 9, in comparison with the above-described embodiment, an extra switch component S405 is added at the input terminal and a first switch unit SW91 and a second switch unit SW92 are employed.

When the clock signal CLK takes, for example, a logic-high level, the first terminal and the second terminal of the switch components S401, S402, S403, S404 and S405 are in connection, and the first switch unit SW91 is on and the second switch unit SW92 is off, which makes the input terminal 1301 couple with the transistor MP1 and the gate of the transistor MP1 produces a bias voltage provided to the transistors MP2~MP5. The transistor MP2 is coupled with the first output node OUT1, the transistor MP3 is coupled with the second output node OUT2, the transistor MP4 is coupled with the third output node OUT3 and the transistor MP5 is coupled with the fourth output node OUT4, so that the currents produced by the transistors MP2~MP5 are provided to the output nodes OUT1~OUT4.

When the clock signal CLK takes, for example, a logic-low level, the first terminal and the third terminal of the switch components S401, S402, S403, S404 and S405 are in connection, and the first switch unit SW91 is off and the second switch unit SW92 is on, which makes the input terminal I301 couple with the transistor MP5, and the transistor MP5 now functions as the transistor MP1 and the gate of the transistor MP5 produces a bias voltage provided to the transistors MP1~MP4. The transistor MP1 is coupled with the first output node OUT1, the transistor MP2 is coupled with the second output node OUT2, the transistor MP3 is coupled with the third output node OUT3 and the transistor MP4 is coupled with the fourth output node OUT4, so that the currents produced by the transistors MP1~MP4 are sent to the output nodes OUT1~OUT4.

Figure 10:
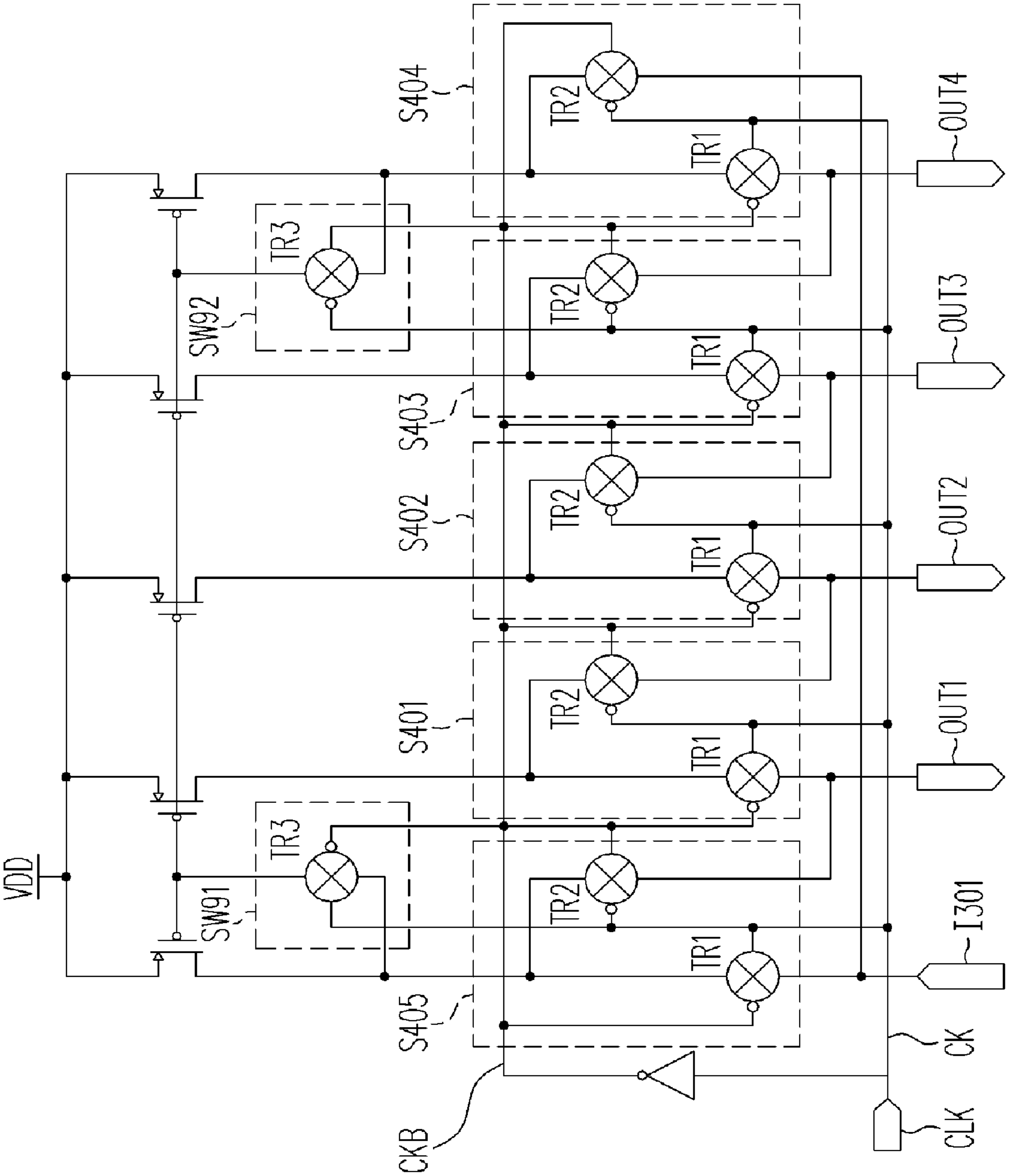
FIG. 10 is an implementation circuit drawing of the present embodiment in FIG. 9.

The above-described embodiment can be further modified, so that the input current channel is also controlled by the chain-chopping operation. The modified circuit has advantages that not only improving the current equality between adjacent channels, but also reducing the current difference accumulated with layers and caused by the unmatched input transistor. Referring to FIG. 10, it is an implementation circuit drawing of the present embodiment in FIG. 9. In the implementation circuit, all switch components S401~S405 are substituted by a first transmission-gate TR1 and a second transmission-gate TR2, all switch units SW91~SW92 are substituted by a third transmission-gate TR3, and the clock signal CLK is divided into a first clock signal CK and a second clock signal CKB, which are phase-inverted to each other. In this way, the switching operations in FIG. 9 are implemented.

In both FIG. 9 and FIG. 10, P-type transistors are employed. However, anyone skilled in the art should know that the embodiment of the present invention can employ N-type transistors instead of P-type transistors. With the N-type transistors used in the circuit, the circuit requires a first voltage level with a lower power supply voltage VSS instead of the first voltage level with a higher power supply voltage VDD required by the original circuit, which is a common knowledge and the description is omitted herein for simplicity. Anyone skilled in the art knows that the transmission-gate can be implemented by using the structure similar to FIG. 11. Besides, the operations of the components are the conventional knowledge in the art too, so the detail is omitted herein.

Figure 12:
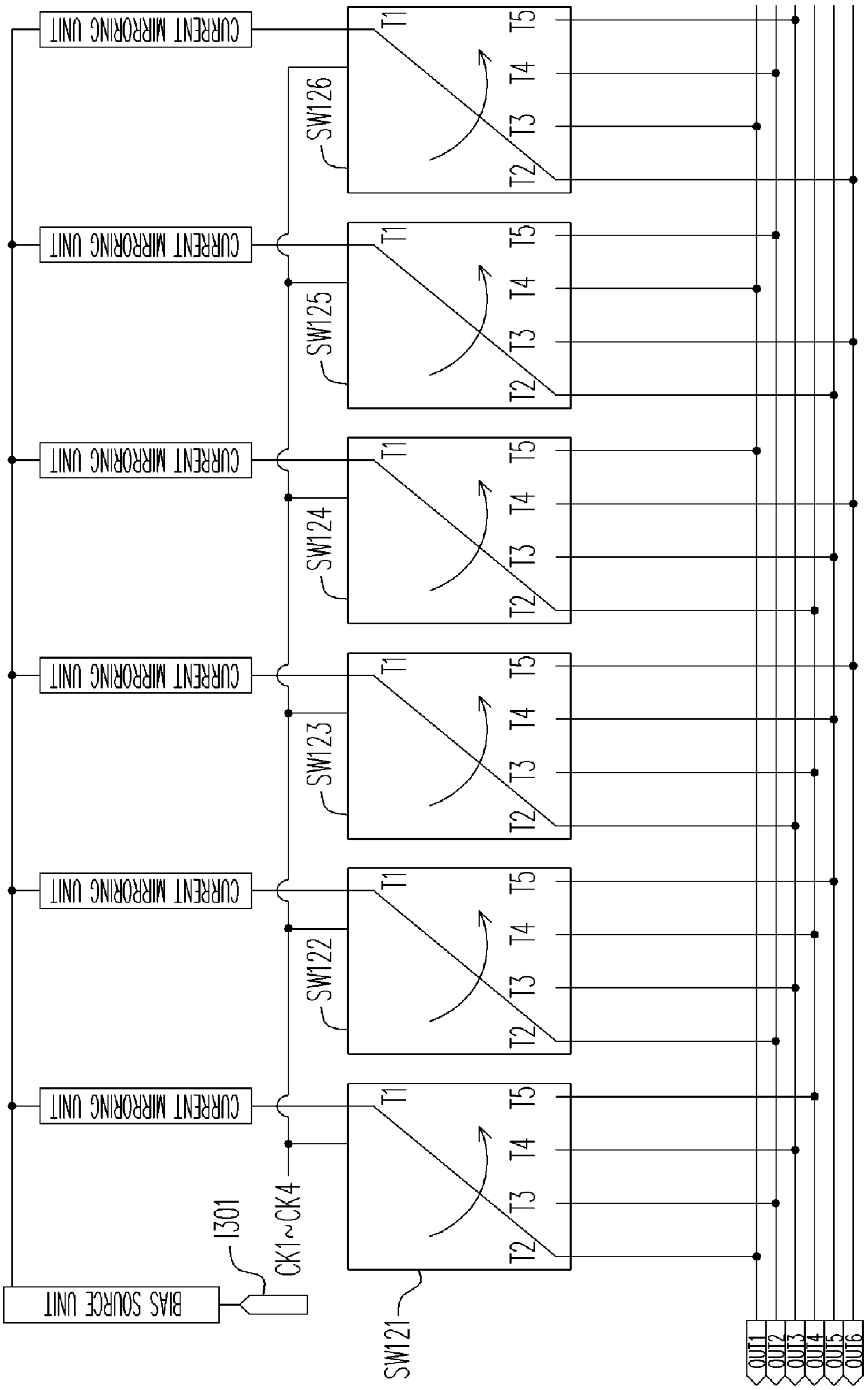
FIG. 12 is a circuit drawing of a chain-chopping current mirror circuit according to yet another embodiment of the present invention.

The above-described embodiments have disclosed the chain-chopping current mirror circuits for switching two current channels; the present invention further provides a chain-chopping current mirror circuit for switching multiple channels. FIG. 12 is a circuit drawing of a chain-chopping current mirror circuit according to yet another embodiment of the present invention. Referring to FIG. 12, the circuit includes a bias source unit 1201, six current mirroring units 1202, six switch components 1203 and six output nodes OUT1~OUT6, wherein the switch component SW121~SW126 includes five terminals T1~T5, respectively. Each of the switch components determines the terminal T1 to couple one of the terminals T2~T5 according to the clock signals CK1~CK4.

Figure 13:
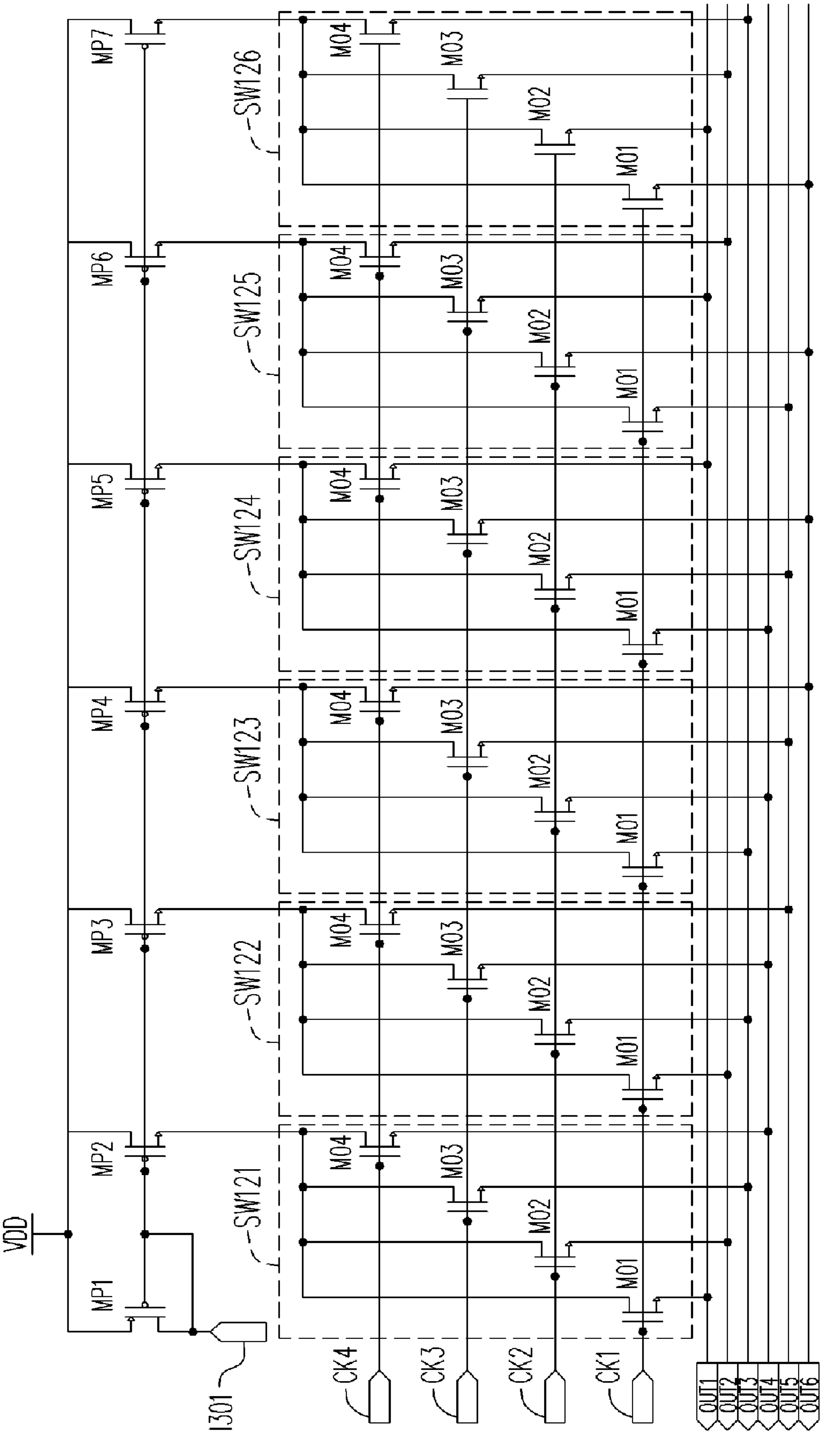
FIG. 13 is an implementation circuit drawing of the present embodiment in FIG. 12.

FIG. 13 is an implementation circuit drawing of the present embodiment in FIG. 12. Referring to FIG. 13, the bias source unit 1201 is implemented by using a P-type transistor MP1, the six current mirroring units 1202 are implemented by using P-type transistor MP2~MP7, respectively, each of the switch components SW121~SW126 is implemented by using four switch units M01~M04, and each of the switch units M01~M04 is implemented by using an N-type transistor.

When the first clock signal CK1 takes, for example, a logic-high level and the rest clock signals CK2~CK4 take a logic-low level, all the switch units M01 are on, the switch units M02~M04 are off, the transistor MP2 is coupled with the first output node OUT1, the transistor MP3 is coupled with the second output node OUT2, the transistor MP4 is coupled with the third output node OUT3, the transistor MP5 is coupled with the fourth output node OUT4, the transistor MP6 is coupled with the fifth output node OUT5 and the transistor MP7 is coupled with the sixth output node OUT6.

When the second clock signal CK2 takes, for example, a logic-high level and the rest clock signals CK1, CK3 and CK4 take a logic-low level, all the switch units M02 are on, the switch units M01, M03 and M04 are off, the transistor MP2 is coupled with the second output node OUT2, the transistor MP3 is coupled with the third output node OUT3, the transistor MP4 is coupled with the fourth output node OUT4, the transistor MP5 is coupled with the fifth output node OUT5, the transistor MP6 is coupled with the sixth output node OUT6 and the transistor MP7 is coupled with the first output node OUT1.

When the third clock signal CK3 takes, for example, a logic-high level and the rest clock signals CK1, CK2 and CK4 take a logic-low level, all the switch units M03 are on, the switch units M01, M02 and M04 are off, the transistor MP2 is coupled with the third output node OUT3, the transistor MP3 is coupled with the fourth output node OUT4, the transistor MP4 is coupled with the fifth output node OUT5, the transistor MP5 is coupled with the sixth output node OUT6, the transistor MP6 is coupled with the first output node OUT1 and the transistor MP7 is coupled with the second output node OUT2.

When the fourth clock signal CK4 takes, for example, a logic-high level and the rest clock signals CK1~CK3 take a logic-low level, all the switch units M04 are on, the switch units M01~M03 are off, the transistor MP2 is coupled with the fourth output node OUT4, the transistor MP3 is coupled with the fifth output node OUT5, the transistor MP4 is coupled with the sixth output node OUT6, the transistor MP5 is coupled with the first output node OUT1, the transistor MP6 is coupled with the second output node OUT2 and the transistor MP7 is coupled with the third output node OUT3. Subsequently, the next cycle of the chain-chopping operations is repeated according to the clock signals CK1~CK4.

Figure 11:
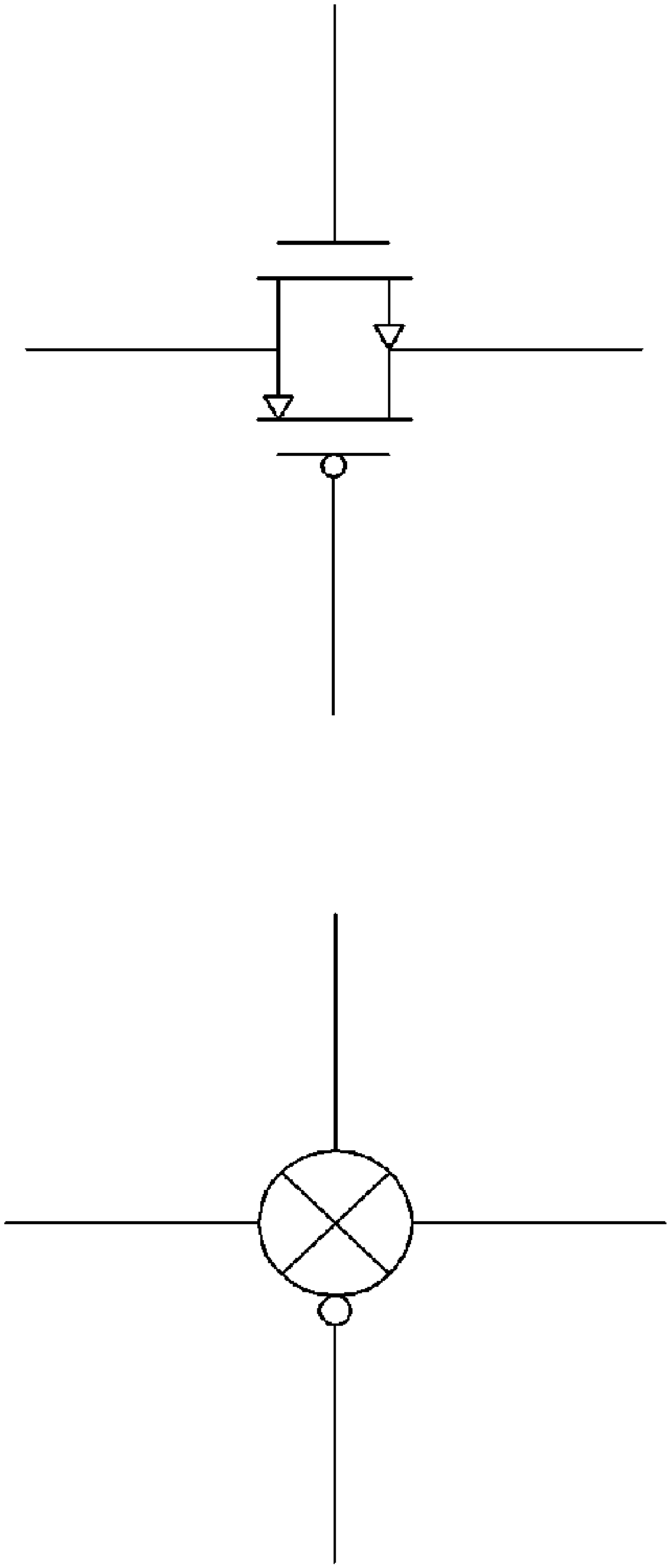
FIG. 11 is an implementation circuit drawing of a transmission-gate according to an embodiment of the present invention.

It is a common knowledge for anyone skilled in the art that all the switch units M01~M04 can be implemented by multiple means, such as by using P-type transistors or by using transmission-gates as shown in FIG. 11. For those modifications, the clock signals need to be modified too. In the embodiment, N-type transistors, but not limited to by the present invention, are used to implement the above-described switch units. Similarly, although in the embodiment, the P-type transistors MP1~MP7 are used to implement the above-described bias source unit 1201 and current mirroring units 1202, but N-type transistors are also feasible instead of the P-type transistors MP1~MP7 and the present invention does not limit it. Note that although the above-described embodiments take four current channels to form a chain-chopping current mirror as exemplary, however, according to the spirit of the present invention, three current channels, five current channels or more current channels can be used to form a chain-chopping current mirror, which is not limited by the invention.

In summary, since every current channel is connected in series to each other through multiple switches for series-switching operations, thus, the present invention is able to advance the equality of the output currents and further accordingly reduce the current difference between adjacent current channels.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A chain-chopping current mirror, comprising:

a plurality of output nodes;

a bias source unit, comprising an input terminal and a reference voltage terminal, used for providing a reference bias at the reference voltage terminal thereof according to the current received by the input terminal thereof;

a plurality of current mirroring units, wherein each of the current mirroring units comprises a bias input terminal and an output terminal, the bias input terminal is coupled with the reference voltage terminal of the bias source unit to receive the reference bias and an output current is given at the output terminal thereof according to the reference bias; and a plurality of switch components, wherein each of the switch components comprises a first terminal, a second terminal, a third terminal and a control terminal, the control terminal receives a clock signal, and according to the clock signal the switch component determines whether the first terminal thereof is coupled with the second terminal or the third terminal thereof;

wherein, a number of the switch components is larger than 2, the first terminal of the $i^{th}$ switch component is coupled with the output terminal of the $i^{th}$ current mirroring unit, the second terminal thereof is coupled with the $i^{th}$ output node and the third terminal thereof is coupled with the $(i+1)^{th}$ output node, where i is a natural number which is less than or equal to the number of the switch components, but the third terminal of the last switch component is coupled with the first output node.

2. The chain-chopping current mirror as recited in claim 1, wherein the bias source unit comprises:

a first transistor, wherein the gate thereof is coupled with the first source/drain thereof, the second source/drain thereof is coupled with a first voltage level, the first source/drain thereof is coupled with the input terminal of the bias source unit and the gate thereof is coupled with the reference voltage terminal of the bias source unit.

3. The chain-chopping current mirror as recited in claim 2, wherein the bias source unit further comprises:

a second transistor, wherein the gate thereof is coupled with a bias voltage, the first source/drain thereof is coupled with the input terminal of the bias source unit and the second source/drain thereof is coupled with the first source/drain of the first transistor.

4. The chain-chopping current mirror as recited in claim 3, wherein the first transistor and the second transistor are P-type metal oxide semiconductor field effect transistors (P-type MOSFETs).

5. The chain-chopping current mirror as recited in claim 2, wherein each of the current mirroring units comprises:

a third transistor, wherein the gate thereof is coupled with the reference voltage terminal to receive the reference bias, the first source/drain thereof is coupled with the output terminal of the current mirroring unit and the second source/drain thereof is coupled with the first voltage level.

6. The chain-chopping current mirror as recited in claim 5, further comprising:

a first switch unit, coupled between the gate and the first source/drain of the first transistor;

a second switch unit, coupled between the gate and the first source/drain of the third transistor of the $k^{th}$ current mirroring unit; and a third switch unit, having a first, second, third and control terminals;

wherein, the first terminal of the $k^{th}$ switch component is coupled with the output terminal of the $k^{th}$ current mirroring unit, the second terminal thereof is coupled with the $k^{th}$ output node, the third terminal thereof is coupled with the input terminal of the bias source unit, the first terminal of the third switch unit is coupled with the first source/drain of the first transistor, the second terminal thereof is coupled with the input terminal of the bias source unit and the third terminal thereof is coupled with the first output node, where k is a natural number which is less than or equal to the number of the switch components.

7. The chain-chopping current mirror as recited in claim 1, wherein each of the current mirroring units comprises:

a third transistor, wherein the gate thereof is coupled with the reference voltage terminal to receive the reference bias, the first source/drain thereof is coupled with the output terminal of the current mirroring unit and the second source/drain thereof is coupled with a first voltage level.

8. The chain-chopping current mirror as recited in claim 7, wherein the bias source unit further comprises:

a fourth transistor, wherein the gate thereof is coupled with a bias voltage, the first source/drain thereof is coupled with the output terminal of the current mirroring unit and the second source/drain thereof is coupled with the first source/drain of the third transistor.

9. The chain-chopping current mirror as recited in claim 8, wherein the third transistor and the fourth transistor are P-type MOSFETs.

10. The chain-chopping current mirror as recited in claim 1, wherein the clock signal comprises a first clock signal and a second clock signal, and each of the switch components comprises:

a first transmission-gate, comprising a first control terminal, a second control terminal, a first transmission terminal and a second transmission terminal, wherein the first control terminal receives the first clock signal, the second control terminal receives the second clock signal, the first transmission terminal is coupled with the first terminal of the switch component and the second transmission terminal is coupled with the second terminal of the switch component; and a second transmission-gate, comprising a first control terminal, a second terminal, a first transmission terminal and a second transmission terminal, wherein the first control terminal receives the second clock signal, the second control terminal receives the first clock signal, the first transmission terminal is coupled with the first terminal of the switch component and the second transmission terminal is coupled with the third terminal of the switch component.

11. A method for stabilizing output currents, comprising:

providing a plurality of output nodes;

providing a reference bias according to an input current;

providing a plurality of current mirroring units, wherein each of the current mirroring units outputs an output current according to the reference bias, and a number of the current mirroring units is larger than 2;

at a first time, making the output terminal of the $i^{th}$ current mirroring unit couple to the i th output node; and at a second time, making the output terminal of the $i^{th}$ current mirroring unit couple to the $(i+1)^{th}$ output node, but the last current mirroring unit is coupled to the first output node;

wherein, i is a natural number which is less than or equal to the number of the current mirroring units.

12. The method for stabilizing output currents as recited in claim 11, further comprising:

providing a clock signal, wherein the time corresponding to the first status of the clock signal is the first time, while the time corresponding to the second status of the clock signal is the second time.

13. A chain-chopping current mirror, comprising:

a plurality of output nodes;

a bias source unit, comprising an input terminal and a reference voltage terminal, used for providing a reference bias at the reference voltage terminal thereof according to the current received by the input terminal thereof; and a plurality of current mirroring units, wherein each of the current mirroring units comprises a bias input terminal and an output terminal, the bias input terminal is coupled with the reference voltage terminal of the bias source unit to receive the reference bias and an output current is given at the output terminal thereof according to the reference bias; and a plurality of switch components, wherein each of the switch components comprises $(1\sim K+1)^{th}$ terminals, and according to $(1\sim K)^{th}$ clock signals the switch component determines one of the $(2\sim K+1)^{th}$ terminals to couple to the first terminal thereof, and K is larger than 2;

wherein, the first terminal of the $i^{th}$ switch component is coupled with the output terminal of $i^{th}$ current mirroring unit, and the $m^{th}$ terminal thereof is coupled with the $((modu(i+m-3)^{n})+1)^{th}$ output node, where i, K, m are natural numbers, m is larger than 1, n is a number of the output nodes, modu(x) is the remainder of the x divided by the n, and n is larger than or equal to K+1.

14. The chain-chopping current mirror as recited in claim 13, wherein each of the switch components comprises:

K switch units, wherein each of the switch units comprises a control terminal, a first terminal and a second terminal, and the control terminals of the $(1\sim K)^{th}$ switch units respectively receive the $(1\sim K)^{th}$ clock signals;

wherein, the first terminal of the $a^{th}$ switch unit is coupled with the first terminal of the switch component, while the second terminal of the $a^{th}$ switch unit is coupled with the $(a+1)^{th}$ terminal of the switch component, wherein each clock signal comprises a first status and a second status, the frequency of every clock signal is the same, there is a predetermined phase difference between the $(b-1)^{th}$ clock signal and the $b^{th}$ clock signal and the time for each clock signal to take the first status is not overlapped with each other, where 0<a, b<≦K.

15. The chain-chopping current mirror as recited in claim 13, wherein the bias source unit comprises:

a first transistor, wherein the gate thereof is coupled with the first source/drain thereof, the second source/drain thereof is coupled with a first voltage level, the first source/drain thereof is coupled with the input terminal of the bias source unit and the gate thereof is coupled with the reference voltage terminal of the bias source unit.

16. The chain-chopping current mirror as recited in claim 15, wherein the bias source unit further comprises:

a second transistor, wherein the gate thereof is coupled with a bias voltage, the first source/drain thereof is coupled with the input terminal of the bias source unit and the second source/drain thereof is coupled with the first source/drain of the first transistor.

17. The chain-chopping current mirror as recited in claim 16, wherein the first transistor and the second transistor are P-type MOSFETs.

18. The chain-chopping current mirror as recited in claim 15. wherein each of the current mirroring units comprises:

a third transistor, wherein the gate thereof is coupled with the reference voltage terminal to receive the reference bias, the first source/drain thereof is coupled with the output terminal of the current mirroring unit and the second source/drain thereof is coupled with the first voltage level.

19. The chain-chopping current mirror as recited in claim 14, wherein each of the switch units is a transistor, the gate of the transistor is a control terminal, the first source/drain thereof is a first terminal and the second source/drain thereof is a second terminal.

20. The chain-chopping current mirror as recited in claim 19, wherein when the transistor is a P-type transistor, the first status takes a logic-low level; and when the transistor is an N-type transistor, the first status takes a logic-high level.

* * * * *